United States Patent [19]

Kay et al.

[11] Patent Number: 4,648,917

[45] Date of Patent: Mar. 10, 1987

[54] NON ISOTHERMAL METHOD FOR EPITAXIALLY GROWING HGCDTE

[75] Inventors: Robert E. Kay, Newport Beach; Hakchill Chan, Corona del Mar; Fred Ju, Huntington Beach; Burton A. Bray, Laguna Niguel, all of Calif.

[73] Assignee: Ford Aerospace & Communications Corporation, Detroit, Mich.

[21] Appl. No.: 769,909

[22] Filed: Aug. 26, 1985

[51] Int. Cl.$^4$ ............................................. H01L 21/365
[52] U.S. Cl. ..................................... 148/175; 156/606; 156/613
[58] Field of Search ................. 156/613, 606; 148/175

[56] References Cited

U.S. PATENT DOCUMENTS

| | | | |
|---|---|---|---|
| 3,622,405 | 11/1971 | Schmit | 148/13 |
| 3,793,070 | 2/1974 | Schoolar | 156/606 |
| 4,418,096 | 11/1983 | Gauthier et al. | 427/76 |
| 4,447,470 | 5/1984 | Kay | 427/76 |
| 4,487,640 | 12/1984 | Erstfeld | 148/175 |
| 4,487,813 | 12/1984 | Kay | 428/620 |

OTHER PUBLICATIONS

Tufte et al., "Growth and Properties of $Hg_{1-x}Cd_xTe$ Epitaxial Layers", *J. Applied Phys.*, vol. 40, No. 11, pp. 4559–4568, (Oct. 1969).
Vohl et al., *J. Electronic Materials*, vol. 7, No. 5, pp. 659–678, (1978), "Vapor Phase Growth of $Hg_{1-x}CD_xTe$ Epitaxial Layers".
Marfaing et al., "A New Process of Crystal Growth: Evaporation-Diffusion Under Isothermal Conditions", Proc. Int'l Conf. on Crystal Growth, Boston, MA, pp. 549–552, (Jun. 20–24 1966).

*Primary Examiner*—George T. Ozaki
*Assistant Examiner*—Beverly A. Pawlikowski
*Attorney, Agent, or Firm*—Edward J. Radlo; Keith L. Zerschling

[57] ABSTRACT

A layer of HgCdTe (15) is epitaxially grown onto a CdTe substrate (5). A HgTe source (3) is spaced from the CdTe substrate (5) a distance of between 0.1 mm and 10 mm. The substrate (5) and source (3) are heated within a temperature range of between 500° C. and 625° C. for a processing step having a duration of between 5 minutes and 4 hours. During at least 5 minutes of this processing step, the substrate (5) is made to have a greater temperature than the source (3). Preferably the substrate (5) is never at a lower temperature than the source (3). The source (3) and substrate (5) are heated together in a thermally insulating, reusable ampoule (17). The CdTe substrate (5) is preferably a thin film epitaxially grown on a support (10) e.g., of sapphire or GaAs. When support (10) is not used, the CdTe substrate (5) is polished; and sublimation and solid state diffusion growth mechanisms are present in the growth of the HgCdTe (15). Means are disclosed for preventing contamination of the reactants during HgTe (3) synthesis and bulk CdTe wafer (5) polishing.

10 Claims, 3 Drawing Figures

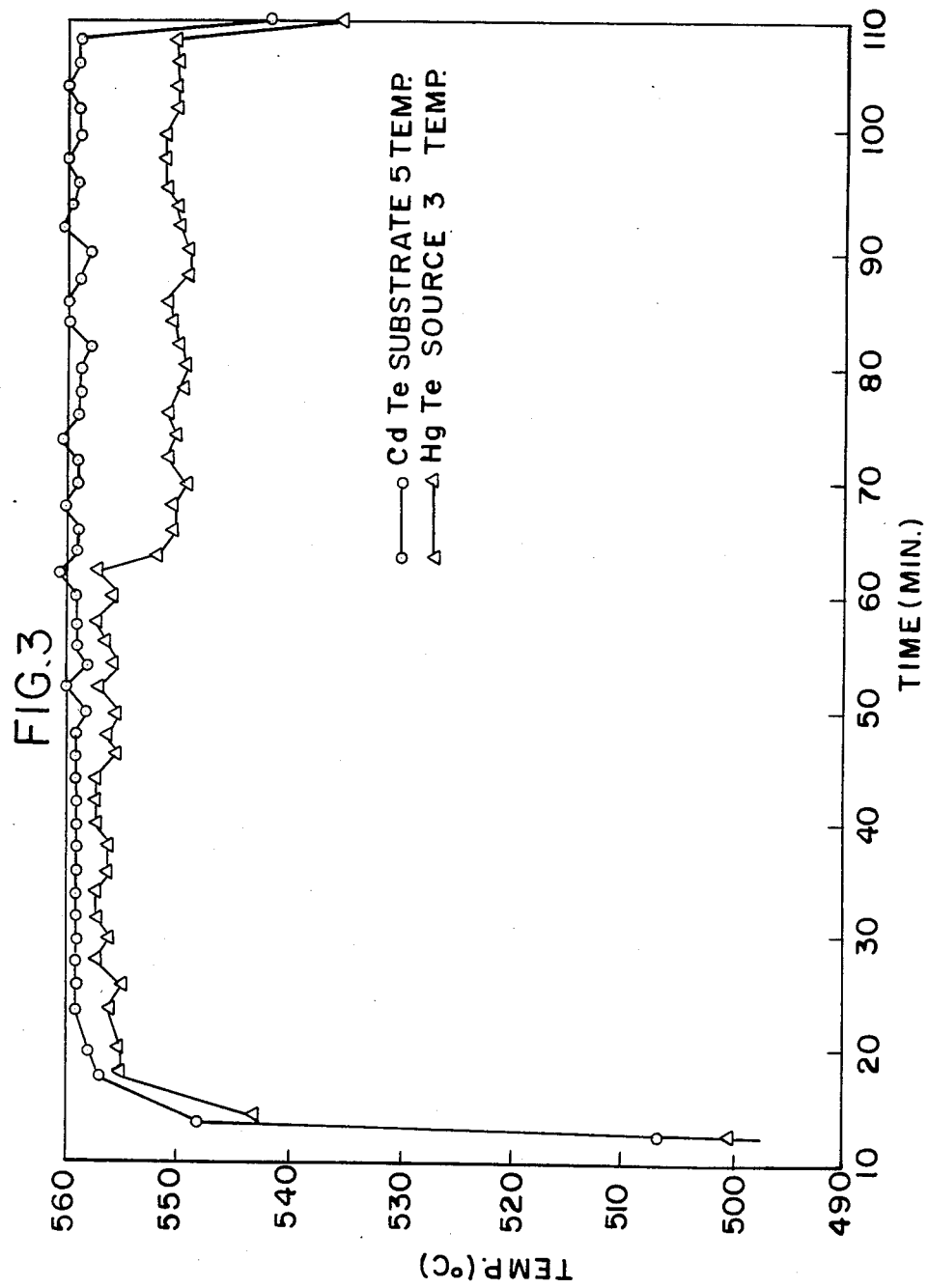

NON ISOTHERMAL METHOD FOR EPITAXIALLY GROWING HGCDTE

DESCRIPTION

TECHNICAL FIELD

This invention pertains to the field of epitaxially growing HgCdTe (mercury cadmium telluride) on CdTe (cadmium telluride) substrates.

BACKGROUND ART

U.S. Pat. Nos. 4,447,470 and 4,487,813 disclose state-of-the-art methods for epitaxially growing HgCdTe upon CdTe substrates. The method described in these two patents differs from that of the present invention in that the HgTe source and CdTe substrate are maintained at the same temperature during the processing step, whereas in the present invention, the HgTe source 3 is heated to a different temperature than the CdTe substrate 5 for at least part of the growth step. As a result, the compositional profile of the finished HgCdTe is desirably sharper when the present invention is used. This is graphically indicated in FIG. 2, in which the compositional profile associated with these two prior art patents is labeled "prior art" and compared with a typical compositional profile associated with the teachings of the present invention. In the prior art, the mole fraction (x) of cadmium in the epitaxially grown HgCdTe which is a distance of at least 20% of the HgCdTe layer thickness away from the CdTe substrate varies by no more than 10% as a function of said distance. The compositional profile of the present invention is sharper, in that the mole fraction (x) of cadmium in the epitaxially grown HgCdTe 15 which is a distance of at least 10% of the HgCdTe layer 15 thickness away from the CdTe substrate 5 varies by no more than 10% as a function of said distance. The present invention also offers the advantage that the x-value can be changed by changing the temperatures during the growth run, without having to change the mole fraction of Hg in the HgTe source.

U.S. Pat. No. 4,487,640 discloses a method for epitaxially growing HgCdTe onto CdTe substrates, which method differs from that of the present invention in that: (1) It uses two different sources (16 and 20) maintained at different temperatures, whereas the present invention uses one source. (2) It is not a closely-spaced process, whereas the present invention is. As used herein, "closely-spaced" means the HgTe source and CdTe substrate are spaced apart between 0.1 mm and 10 mm. (3) It uses a carrier gas ($H_2 + HX$), whereas the present invention does not. (4) The source zones ($T_2$ and $T_3$) are hotter than the substrate zone ($T_1$), which is the opposite of the temperature relationship in the present invention. (5) It does not vary the temperatures over the course of the growth phase, whereas the present invention sometimes does.

Tufte et al., "Growth and Properties of $Hg_{1-x}Cd_xTe$ Epitaxial Layers", *J. Applied Phys.*, Vol. 40, No. 11, pp. 4559–4568 (October 1969) describe primarily isothermal methods for growing HgCdTe onto CdTe substrates. On p. 4564 of this reference, the authors discuss their unsuccessful attempts at using a non-isothermal method. The results were unsuccessful because the grown layer had a surface that was pure HgTe rather than HgCdTe, or else had a significant compositional profile, apparently due to the interdiffusion of mercury and cadmium. The reference method differs from that of the present invention in that HgCdTe, rather the HgTe, is used as the source, and the source is kept hotter than the substrate, providing an additional driving force for the transfer of material from the source to the substrate. In the present invention, on the other hand, the substrate 5 is made to be hotter than the source 3.

U.S. Pat. No. 4,418,096 discloses a method for epitaxially growing HgCdTe onto a CdTe substrate, which differs from the method of the present invention in that: (1) It uses dangerous mercury overpressures of between 4 and 50 atmospheres, col. 4, lines 34–36, whereas the present invention does not use mercury overpressure. (2) The finished layers are at least 158 microns thick, whereas the layers 15 of the present invention are no more than 30 microns thick. (3) The processing time is at least 8 days, whereas that of the present invention is no more than 4 hours. Such a long processing time is inconvenient, to say the least. (4) The compositional profile is not nearly as good. (5) The source and substrate are always at the same temperature with respect to each other; this is not true in the present invention.

U.S. Pat. No. 3,622,405 relates to the growth of bulk HgCdTe crystals, not epitaxial layers of same, that are annealed by raising them to temperatures in the vicinity of 755° C.

Vohl et al., *J. Electronic Materials*, Vol. 7, No. 5, pp. 659–678 (1978), discloses a "hot wall" process for making HgCdTe, rather than a closely-spaced process, in which the starting ingredients are elemental Hg, Cd, and Te.

Early investigators employing the isothermal close-spaced vapor phase epitaxy (isothermal CSVPE) growth process grew very thick layers of HgCdTe using long growth periods compared with the present invention's HgCdTe layers 15 having thicknesses of between 0.7 and 30 micrometers grown in short time periods (5 minutes to 4 hours). E.g., see Marfaing et al., "A New Process of Crystal Growth: Evaporation-Diffusion Under Isothermal Conditions", *Proc. Int'l Conf. on Crystal Growth*, Boston, MA, pp. 549–552 (June 20–24, 1966). Prior workers considered the growth process to be limited to a solid-state diffusion process, in which only a pseudo-control of composition is obtained, by added Hg pressure. In the non-isothermal linear growth vapor phase epitaxy (non-isothermal LGVPE) method described in the instant specification, a second mechanism, sublimation, is involved, particularly in those embodiments where support 10 is not used; this sublimation mechanism is probably the dominant growth form for the early growth period. Furthermore, the diffusivities of Hg and Cd and control of HgTe 3 and HgCdTe 15 decomposition rates are used in the present invention to produce HgCdTe layers 15 of any desired composition with compositional profiles that are far less graded than those produced by the isothermal methodology. This is because the present invention controls the source 3 and substrate 5 temperatures independently.

In the instant process, the growth rate is linearly related to time; thus, the characterization "linear growth" vapor phase epitaxy. During the growth period, and CdTe substrate 5 sublimes to provide Cd and $Te_2$, which react with Hg to form HgCdTe 15 at the CdTe substrate 5 surface. The sublimed Cd and Te come from all surfaces of the CdTe substrate 5, but primarily from the back (i.e., the side not facing the grown HgCdTe layer 15; the top in FIG. 1). However, as the HgCdTe 15 growth process continues, this source of Cd and $Te_2$ is attenuated due to substrate 5 being coated with HgCdTe 15 (growth on the back of the CdTe substrate 5 is much slower than on the side facing the HgCdTe layer 15). Consequently, with long growth periods, only the solid state diffusion mechanism appears to be operational.

DISCLOSURE OF INVENTION

In this method for epitaxially growing a layer of HgCdTe (15) onto a CdTe substrate (5), a HgTe source (3) is spaced from the CdTe substrate (5) a distance of between 0.1 millimeter and 10 millimeters. The substrate (5) and source (3) are heated within a temperature range of between 500° C. and 625° C. for a processing step having a duration of between 5 minutes and 4 hours. During at least 5 minutes of this processing step, the substrate (5) is made to have a greater temperature than the source (3).

Preferably, the substrate (5) is never at a lower temperature than the source (3). The epitaxially grown HgCdTe layer (15) has a thickness of between 0.7 microns and 30 microns. The source (3) is $Hg_yTe$ where y is between 0.8 and 1, inclusively. The source (3) and substrate (5) are heated together in a thermally insulating reusable ampoule (17).

The CdTe substrate (5) is preferably a thin film epitaxially grown on a support (10), e.g., of sapphire or GaAs.

Changing the crystal plane or the axial orientation of the CdTe substrate (5) does not affect the rate of growth of the HgCdTe layer (15), the single crystal nature of the HgCdTe (15), or its mirror-like finish. All other things being equal, the lower the mole fraction of mercury in the HgTe source (3), the greater the mole fraction of mercury in the grown HgCdTe layer (15), and vice-versa.

BRIEF DESCRIPTION OF THE DRAWINGS

These and other more detailed and specific objects and features of the present invention are more fully disclosed in the following specification, reference being had to the accompanying drawings, in which:

FIG. 3 is a graph of temperature versus time for substrate 5 and source 3 for an exemplary growth run which fabricated a HgCdTe layer 15 according to the teachings of the present invention.

BEST MODE FOR CARRYING OUT THE INVENTION

Figure 1:
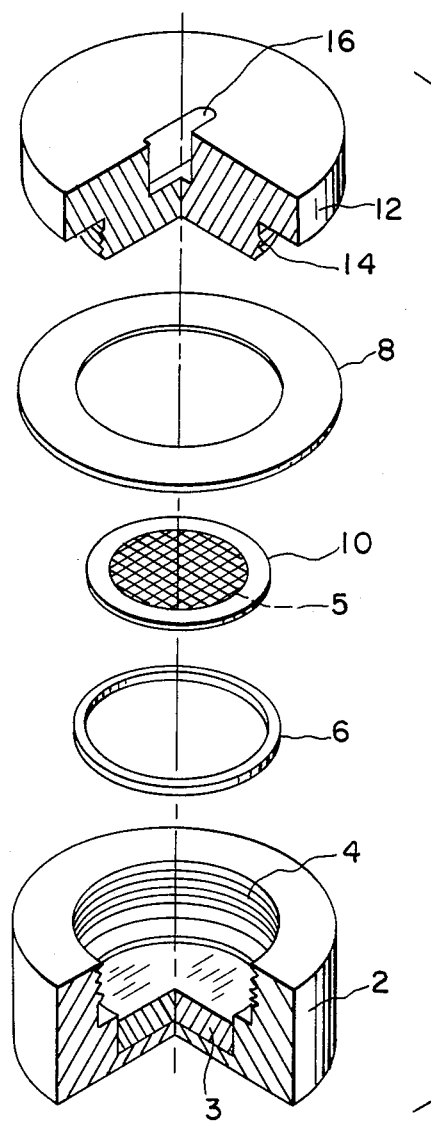
FIG. 1 is an exploded isometric view of a reusable growth apparatus 17 suitable for growing a HgCdTe layer 15 according to the teachings of the present invention.

In the present invention, the x-value of the grown layer 15 increases with temperature and decreases as the Te content of the source 3 increases. An increase in Te pressure increases the transfer rate of the HgTe source 3 to the CdTe substrate 5, and this probably accounts for the decrease in x-value with decreasing excess Te. The reactions and factors that are influenced by the HgTe source 3 and CdTe substrate 5 temperatures are listed in Table I below; all of the reactions shown are driven to the right by an increase in temperature. The only factors which decrease x-value with an increase in temperature are substrate 5 related and include reactions 3, 5 and 6. On the other hand, the source 3 reactions tend to moderate or compensate for the substrate 5 reactions by increasing the x-value with an increase in source temperature.

TABLE I
REACTIONS AND FACTORS INFLUENCED BY
SOURCE 3 AND SUBSTRATE 5 TEMPERATURES

HgTe SOURCE 3 TEMPERATURE
1. Drives $2HgTe \rightleftharpoons 2Hg + Te_2$
2. Controls HgTe Transfer Rate to CdTe Substrate 5

CdTe SUBSTRATE 5 TEMPERATURE
3. Drives $2CdTe \rightleftharpoons 2Cd + Te_2$
4. Drives $2HgCdTe \rightleftharpoons 2Hg + 2Cd + Te_2$
5. Controls HgTe "Sticking" on CdTe Substrate 5
6. Controls Interdiffusion rate of Cd and Hg in HgCdTe and HgTe - CdTe systems Composition is controlled by a balance among the substrate 5 and source 3 reactions. This can best be attained by abandoning the isothermal approach and controlling the source 3 and substrate 5 temperatures individually. A number of substrate 5 and source 3 temperature combinations can produce the same layer 15 composition, since the substrate 5 and source 3 reactions can be balanced with different temperature combinations. Furthermore, sharpening or broadening the compositional profile can be achieved by changing either the substrate 5 or source 3 temperature during the growth run, altering diffusion of Hg and/or Cd in the formed HgCdTe layer 15. To sharpen the compositional profile, it is necessary to increase Hg diffusion into the formed HgCdTe layer 15 while decreasing the rate of deposit of HgTe 3, and/or to increase Cd diffusion into the formed HgCdTe layer 15 while increasing the rate of Cd production. On balance, these requirements can be met by decreasing the source 3 temperature and/or increasing the substrate 5 temperature.

Perhaps the most troublesome feature of existing VPE methods is the use of quartz tubes, pistons and rings as materials for growth ampoules. New quartz is required for each run because the ampoule is destroyed when it is opened. This increases material and preparation costs, makes conversion to a production method difficult, and, most importantly, compounds the problem of contamination coming from the ampoule. Analyses indicate that impurities in the quartz or from the reagents used to "clean" it are the major sources of impurity dopants found in HgCdTe layers formed by CSVPE. The sealing process, which consists of fusing the piston to the ampoule by melting it with an $H_2-O_2$ flame, may also contribute to this problem, since such high temperatures may release impurities from the quartz which otherwise would remain trapped.

Thus, a reusable ampoule is very desirable, not only because it reduces material costs, but most importantly because with reusable ampoules a large improvement in the consistency of producing device quality HgCdTe 15 can be expected. This is so because when containers are repeatedly reused, they undergo self-purification, due primarily to the formation of a pure product coating on their surfaces, and secondarily, to an early leach-out of loosely held contaminants (especially in gas phase reactors).

We have developed a reusable thermally insulating growth fixture 17, as illustrated in FIG. 1. This ampoule can be baked out at 960° C. under $10^{-6}$ torr to free it of surface contaminants. Fixture 17 is made from a thermal insulator, such as machinable boron nitrite-silicon nitrite composite or polycrystalline $Al_2O_3$, to facilitate the maintenance of source 3 and substrate 5 at different temperatures, e.g., by separate annular thermocouples surrounding fixture 17.

Fixture 17 comprises a simple screw-cap lid 12 fitting into a receptacle 2 and sealed by a special low-cost gasket 8 made, e.g., of graphoil. Fixture 17 can be used almost indefinitely and need be recharged with a HgTe source 3 only occasionally. Receptacle 2 is fitted with adapters 6 whose central openings allow growth on a variety of shapes and sizes of substrates 5. In a fixture 17 that has been built, substrate 5 can be up to two inches in diameter. HgTe source 3, which can be a loose powder, a pressed powder, or a slice from an ingot, can accommodate various sized substrates 5, and is left in receptacle 2 for repeated use.

The growth preparation sequence is simple, but requires that assembly take place in an inert atmosphere (e.g., argon). To use the apparatus 17, the appropriate adapter 6 is placed in receptacle 2, substrate 5 is added, gasket 8 is set in place, and lid 12 is screwed on by means of inserting a screwdriver into slot 16. FIG. 1 shows substrate 5 mounted on the underside of optional transparent support 10. Threads 14 of lid 12 engage corresponding threads 4 of receptacle 2. No evacuation of the ampoule 17 is required, since the argon does not adversely affect the growth. The sealed ampoule 17 is then placed in a furnace for the required growth period.

The inner volume of growth fixture 17 must be kept relatively small (less than 10 cc) to maintain the Hg pressure within an effective range.

The HgTe source 3 provides Hg not only by dissociation, but also from interstitial Hg. Since the interstitial Hg concentration is very high, this added Hg pressure is significant and is given by:

$$P_{Hg}(atm) = \frac{1}{2}(4vN_oK_1/VRT)^{\frac{1}{2}}$$

where
v = volume of HgTe source 3
V = inner volume of growth ampoule 17
$N_o = 6.03 \times 10^{23}$
$K_1 = 2.5 \times 10^{20}$
T = growth temperature (°C.)
R = gas constant The above equation shows that one must control both growth ampoule 17 volume and HgTe 3 volume if reproducible Hg pressures are to be obtained. The volume of the HgTe source 3 is fixed within a narrow range; however, volumes of the prior art quartz ampoules can vary significantly, since it is difficult to reproduce the seal and because the dimensions of quartz tubing are subject to considerable variation. On the other hand, with the machined growth fixture 17 shown in FIG. 1, this volume is desirably always the same.

Figure 2:
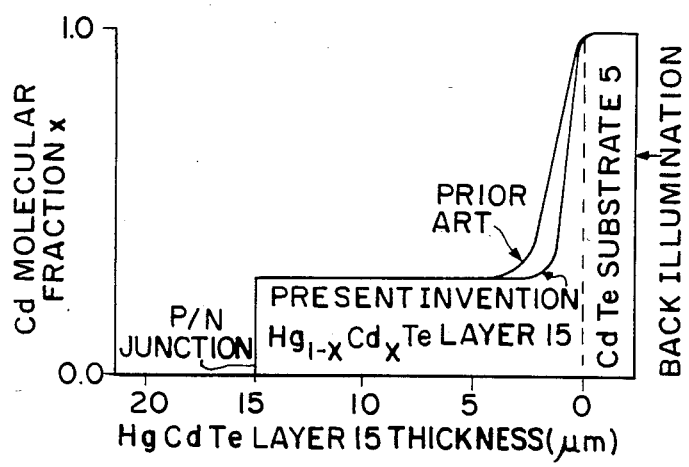
FIG. 2 is a compositional profile of a HgCdTe layer 15 fabricated according to the teachings of the present invention, compared with that for a layer made following the teachings of the prior art U.S. Pat. Nos. 4,447,470 and 4,487,813.

The CdTe substrate 5 is preferably epitaxially grown on a sapphire or GaAs support 10. When used, support 10 is preferably infrared-transparent so layer 15 can be back-illuminated (see FIG. 2). For example, a film of CdTe is deposited on sapphire support 10 by an ion-pumped ultrahigh vacuum MBE system having a base pressure of less than $1 \times 10^{-8}$ torr. A single Radak II oven (manufactured by Luxel Corp.) can be used, fitted with a Coors AD998 $Al_2O_3$ crucible, and used as an MBE vapor source. The crucible contains 30 g of CdTe in the form of approximately 1 cc cubes cut from an ultrahigh purity, undoped, high resistivity ($10^8$ ohm-cm) ingot. The sapphire supports 10 are mounted on a Mo heater block and held in place with a Mo mask defining the deposition geometry. The sapphire 10 is preannealed at about 925° C. CdTe films 5 varying in thickness from 1 to 8 microns are grown at deposition rates from 1.5 to 7.5 angstroms/sec and support 10 temperature ranges from 260° C. to 350° C.

Alternatively, CdTe films 5 can be deposited in a Perkin-elmer ULTEK Rapid Cycle Vacuum System utilizing a mechanical blower to reach 100 torr, a dual stage sorption pump to reach $10^{-2}$ torr, and an 8 part differential ion pump to reach the ultimate base pressure in the low $10^{-9}$ torr region. A titanium sublimator and liquid nitrogen jacket are used to increase pumping speed. An 18 inch glass bell jar houses the deposition chamber. Sapphire supports 10 are mounted in a molybdenum heater assembly which heats the supports 10 to an annealing temperature of 925° C. A Radak II heater with a one inch aperture sublimes the CdTe onto the support 10. A UTI mass spectrometer is used to monitor the partial pressures of the residual gases during deposition.

Sapphire epitaxial grade supports 10, supplied by Union Carbide, are prepared for deposition in Class 100 hoods in a Class 1000 clean room. The supports 10 are degreased with a hot solvent spray, HF and HCl acid, and an $NH_3OH$ rinse to further remove organics and other particulates on their surfaces. Once chemically cleaned, the supports 10 are mounted in the heater assembly and the chamber is then pumped down to $10^{-8}$ torr. The supports 10 are then subjected to a 925° C. anneal for 20 minutes. Before growth, the CdTe is outgassed at 600° C. for 5 minutes. The CdTe is then allowed to cool to 550° C. while the support 10 is cooled to about 290° C. The shutter of the bell jar is then opened to begin the deposition. Typical growth rates are about two microns per hour.

When sapphire is used as a support 10, the amount of epitaxially grown CdTe 5 is limited to a layer between 4 and 5 microns thick, and there is no back surface to provide an additional sublimating Cd source for HgCdTe 15 growth. This limited amount of CdTe 5 can be a problem for growth systems having large volumes, since all of the CdTe 5 can sublime off the sapphire 10 before HgCdTe 15 growth begins. These difficulties can be mitigated by keeping the growth fixture 17 free volume small and/or providing an additional source of CdTe in the form of a polycrystalline CdTe wafer placed on the backside of the sapphire 10.

A typical growth apparatus 17 used successfully has a free volume of 2 cm$^3$; consequently, only $8.8 \times 10^{-11}$ moles of CdTe 5 need evaporate into the fixture 17 to saturate the volume at 570° C. This corresponds to an insignificant loss of 5.7 picometers in CdTe 5 thickness. Therefore, an additional Cd source is not necessary. The HgCdTe 15, which is formed almost exclusively by diffusional growth, is of excellent quality. Its compositional profile can be controlled by proper regulation of substrate 5 and source 3 temperatures, and source 3 composition.

The composition of the HgTe source 3 affects the $Hg_{1-x}Cd_xTe$ layer 15 composition in regard to both x-value and impurity content. It is therefore desirable to have a methodology for forming HgTe 3 which produces a consistent wafer composition and minimizes the introduction of contaminants. The usual methodology for compounding HgTe produces ingots which are not uniform in composition and are subject to contamination from impurities leached from their quartz containers at the high reaction temperature (670° C.). In addition, the operation is hazardous because high Hg pressures (often greater than 10 atms) are produced when the reactants are heated. The product often breaks the ampoule when it cools because it sticks to the wall and has a much higher coefficient of thermal expansion than the quartz.

To overcome these problems, a new methodology for compounding $Hg_yTe$ 3 (where y is between 0.8 and 1.0, inclusively) has been developed. In our procedure, all operations are carried out in an atmosphere control station filled with argon having a $H_2O$ and $O_2$ content of less than 10 ppm. To make the $Hg_yTe$, appropriate quantities of Hg and Te are ground together in a diamonite mortar. Since there is no oxygen to form a protective oxide coating on the Te, the Te and Hg react at room temperature during the grinding operation to produce a black powder of $Hg_yTe$. This powder is placed in receptacle 2 of growth apparatus 17, and pressed into a pellet for use as source 3. This procedure eliminates both the hazard associated with compounding HgTe and the contamination due to impurities leaching from hot quartz into the source 3.

CdTe 5 on sapphire supports 10 are used as grown and do not require polishing. However, the surface of a bulk CdTe wafer 5 is not suitable for epitaxial growth of HgCdTe 15 in the "as lapped" condition and must be polished. The perfection to which the surface of the CdTe substrate 5 is polished is a factor in the formation of dislocations and other artifacts (e.g., "orange peel") in the HgCdTe layer 15. It is therefore important to employ the best procedures available to polish CdTe wafers 5 used for epitaxial growth.

To overcome the difficulties inherent in the conventional polishing method known as hydroplaning, we developed a new CdTe polishing method. This method is extremely simple and produces surfaces which are nearly equal in smoothness to hydroplaned samples. The methodology requires only a silicone rubber pad, a chemical etchant, and a lucite wafer holder. Wafers 5 are polished in the following manner. A rough cut CdTe wafer 5 is affixed to the lucite holder with a drop of glycerol and polished on the silicone rubber pad wet with 2% $Br_2$ in methanol solution by movement in a figure eight pattern. The silicone rubber pad removes the surface coating of $TeO_2$ from wafer 5, much like a windshield wiper, and allows a steady uniform chemical etch of the surface. Because of its softness, the silicone rubber has no abrasive effect on wafer 5. The surface is finished by continuing the polishing in a 1:1 mixture of glycerol and methanol containing 0.5% $Br_2$. HgCdTe layers 15 grown on wafers polished by this technique have interface structures, as revealed by TEM, which are indistinguishable from layers grown on hydroplaned CdTe 5.

As an example of the non-isothermal epitaxial HgCdTe 15 growth method, the procedure for growing 4.5 micron $\lambda_{co}^{300}$ HgCdTe 15 on a CdTe substrate 5 that has been epitaxially grown on a sapphire support 10 will now be described. All operations are carried out in an atmosphere control station until after the growth apparatus 17 is sealed.

A one inch diameter CdTe substrate 5 epitaxially grown on a sapphire support 10 is prepared by the procedure described previously, and transferred to the atmosphere control station. A $Hg_{0.9}Te$ source 3 is prepared by grinding together 5.0 g of Te and 7.7 g of Hg. This amalgam is placed in receptacle 2 of reusable growth apparatus 17. The growth apparatus 17 is assembled and sealed by the method described previously, then removed from the atmosphere control station and placed in a microprocessor controlled two-zone furnace.

The growth step, which has a duration of 110 minutes, is illustrated in FIG. 3. Source 3 and substrate 5 start at ambient room temperature. The temperatures of substrate 5 and source 3 are ramped to about 559° C. and 555° C., respectively, over a period of 20 minutes. During the growth step, the source 3 temperature never exceeds the substrate 5 temperature; this is important, since it prevents spurious droplets of HgTe and/or Te from forming on substrate 5. The layer 15 is allowed to grow for about 40 minutes (from t=20 minutes to t=60 minutes) at constant substrate 5 and source 3 temperatures. The source 3 temperature (but not the substrate 5 temperature) is then abruptly lowered (to about 550° C.) and growth continued for another 45 minutes, during which time the compositional profile of layer 15 is sharpened.

From t=105 minutes to t=110 minutes, source 3 and substrate 5 are cooled down towards ambient temperature; during this cool-down period, HgCdTe 15 continues to grow, invariably Hg-rich and n-type. Depending upon the rate of cool-down, the cool-down thickness varies from a few hundred angstroms to 2-3 microns. The illustrated growth run is considered terminated with substrate 5 at about 543° C. and source 3 at about 536° C. Unless it is desired to use this naturally formed p-n heterojunction, e.g., for fabrication of mesa diodes, the surface is etched to remove the Hg-rich skin. This is done by the technique described previously in conjunction with polishing bulk CdTe wafers 5, using 0.5% $Br_2$ dissolved in 1:1 methanol glycerol and 300 figure eights, which removes about 3 microns of HgCdTe 15. The result is an exceedingly smooth, mirror-like layer 15 having a thickness of about 14 microns and a $\lambda_{co}^{300}$ of about 4.5 microns.

Even HgCdTe layers 15 having perfect crystallinity and optical properties are of little use for electro-optic device fabrication if their electrical properties are rendered unfit by contamination with electro-active species. Therefore, contamination control is of great importance in the production of epitaxial HgCdTe layers 15 for electro-optic devices.

Contaminants arise from the following sources: (a) the ambient environment; (b) the reactants HgTe and CdTe; and (c) the growth apparatus.

Contaminants from the ambient environment consist of particulates encountered on work surfaces and in the ambient atmosphere, and gases and vapors (including oxygen and water) present in the atmosphere. To lessen contamination from these sources, all of the apparatus assembly and material preparation (except bulk CdTe wafer 5 polishing) should be performed in an atmosphere control station. A typical atmosphere control station contains a high purity argon atmosphere that is continually cycled through a purifier to remove oxygen, water vapor, particulates, and many chemical species. This system provides a work area which has an average oxygen and water content of less than 10 ppm and is essentially particle free.

Contaminants which arise from the HgTe source 3 and the CdTe substrate 5 are due to substances inherent in the materials or deposited on or in the materials during preparation or synthesis. We purchase bulk CdTe substrates 5, and six 9's Te and seven 9's Hg packed in argon for the synthesis of the HgTe 3. Consequently, we have no method for controlling the contaminants inherent to these materials initially. We have concentrated our efforts on preventing contamination of the reactants during HgTe 3 synthesis and bulk CdTe wafer 5 polishing. Combinations of CdTe substrates 5 epitaxially grown on sapphire supports 10 do not require polishing; they are transported in plastic boxes from the preparation chamber to the atmosphere control station. To lessen the probability that bulk CdTe substrate 5 surfaces are contaminated during polishing, such operations are carried out in a laminar flow hood, and the wafer 5 is handled only with forceps or plastic fixtures. This appears to be a successful procedure, since SIMS analysis of such CdTe surfaces 5 fails to reveal any contaminants. To prevent contamination of HgTe 3 during synthesis, the HgTe 3 is compounded in the atmosphere control station.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for epitaxially growing a layer of HgCdTe on a CdTe substrate wherein a HgTe source is spaced from the CdTe substrate a distance of between 0.1 mm and 10 mm, and the CdTe and HgTe are heated within a temperature range of between 500° C. and 625° C. during a processing step having a duration of between 5 minutes and 4 hours, during at least 5 minutes of which the CdTe substrate is hotter than the HgTe source.

2. The method of claim 1 wherein, during the processing step, the CdTe substrate is never at a lower temperature than the HgTe source.

3. The method of claim 1 wherein the epitaxially grown HgCdTe layer has a thickness of between 0.7 micron and 30 microns; and the mole fraction of Cd in the epitaxially grown HgCdTe which is a distance of at least 10% of the HgCdTe layer thickness away from the CdTe substrate varies by no more than 10% as a function of said distance.

4. The method of claim 1 wherein the source is $Hg_yTe$; y is between 0.8 and 1, inclusively; and the Hg and Te have been ground together in an argon environment.

5. The method of claim 1 wherein the CdTe substrate is a thin film epitaxially grown on a support fabricated of a material from the class of materials comprising sapphire and GaAs.

6. The method of claim 1 wherein changing the crystal plane or the axial orientation of the CdTe substrate does not affect the rate of growth of the HgCdTe layer, the single crystal nature of the HgCdTe, or the mirror-like finish of the HgCdTe.

7. The method of claim 1 wherein the lower the mole fraction of Hg in the HgTe source, the greater the mole fraction of Hg in the grown HgCdTe layer, and vice versa.

8. The method of claim 1 wherein, at the beginning of the processing step, the CdTe substrate is at least as hot as the HgTe source, and, at some time during the processing step, the temperature of the HgTe source with respect to the CdTe substrate is lowered.

9. The method of claim 1 wherein the HgTe source and the CdTe substrate are heated together in a thermally insulating reusable ampoule.

10. The method of claim 1 wherein the substrate 5 is a bulk wafer of CdTe that has been polished by a silicone rubber pad wet with a solution of bromine in methanol.

* * * * *